United States Patent
Desaki

(10) Patent No.: US 8,093,137 B2
(45) Date of Patent: Jan. 10, 2012

(54) METHOD OF MANUFACTURING SEMICONDUCTOR WAFER

(75) Inventor: Masatsugu Desaki, Miyazaki (JP)

(73) Assignee: Lapis Semiconductor Co., Ltd. (JP)

( * ) Notice: Subject to any disclaimer, the term of this patent is extended or adjusted under 35 U.S.C. 154(b) by 0 days.

(21) Appl. No.: 12/382,344

(22) Filed: Mar. 13, 2009

(65) Prior Publication Data

US 2009/0263959 A1 Oct. 22, 2009

(30) Foreign Application Priority Data

Apr. 21, 2008 (JP) .................................. 2008-109924

(51) Int. Cl.
*H01L 21/30* (2006.01)
*H01L 21/46* (2006.01)

(52) U.S. Cl. .................... 438/459; 438/906; 438/959

(58) Field of Classification Search .................. 438/459, 438/906, 959
See application file for complete search history.

(56) References Cited

U.S. PATENT DOCUMENTS 5,668,045 A * 9/1997 Golland et al. ............... 438/459
5,937,312 A * 8/1999 Iyer et al. ..................... 438/459

FOREIGN PATENT DOCUMENTS

JP 07-006986 1/1995

* cited by examiner

*Primary Examiner* — Jarrett Stark
*Assistant Examiner* — John M Parker
(74) *Attorney, Agent, or Firm* — Rabin & Berdo, PC

(57) ABSTRACT

A device layer is formed on at least the upper surface of a prime wafer by an epitaxial growth method. Then, a protective film is formed to cover at least the device layer. The lower surface of the prime wafer is ground to have a flat lower surface.

19 Claims, 4 Drawing Sheets

METHOD OF MANUFACTURING SEMICONDUCTOR WAFER

BACKGROUND OF THE INVENTION

1. Field of the Invention

The present invention relates to a manufacturing method for a semiconductor wafer having an epitaxial layer.

2. Description of the Related Art

A silicon wafer is known as a popular semiconductor wafer. One example of the silicon wafer is a prime wafer, which is generally a single-crystal silicon substrate. Another example of the silicon wafer is an epitaxial wafer. The epitaxial wafer is a wafer constructed such that films of a silicon single-crystal having the same crystal structure are deposited on a prime wafer according to the regular arrangement of silicon atoms.

A known manufacturing method of the epitaxial wafer includes the step of depositing a silicon thin film on a completed prime wafer by an epitaxial growth process. Specifically, the prime wafer is heated to approximately 1150 degrees C. in a process chamber, and a monosilane gas and a hydrogen gas are introduced into the chamber. The monosilane gas is pyrolyzed, with the result that silicon atoms are successively deposited on the prime wafer according to the crystal structure of the prime wafer. Consequently, a single-crystal silicon thin film grows on the prime wafer.

The epitaxial wafer obtained by the above-described manufacturing method has a crystal layer with less impurities and defects formed on the wafer surface thereof if the epitaxial wafer is compared with the prime wafer. That is, the layer, where semiconductor elements will be formed, of the epitaxial wafer has a high-quality as compared with the prime wafer, and therefore, it is possible for the epitaxial wafer to exhibit high reliability as a semiconductor device after the semiconductor elements are formed.

Japanese Patent Application Publication (Kokai) No. 7-6986 discloses a method of grinding the semiconductor wafer with high precision to a desired thickness.

SUMMARY OF THE INVENTION

As shown in FIGS. 1A to 1D of the accompanying drawings, an epitaxial wafer 10 manufactured by the above-described epitaxial growth method has a structure in which the upper surface, the side surfaces, and a portion of the lower surface of a silicon substrate 11 are covered with a single-crystal silicon thin film 12 (hereinafter, referred to as an epitaxial layer 12). A silicon oxide film 13 is formed on the remaining portion of the lower surface of the silicon substrate 11 not covered by the epitaxial layer 12. The portion of the epitaxial layer 12 formed on the lower surface of the silicon substrate 11 (hereinafter, referred to as a lower surface epitaxial layer 12a) is an unnecessary layer, which is formed as a monosilane gas and a hydrogen gas run around the lower surface of the silicon substrate 11. For example, as shown in FIG. 1A, the thickness of the lower surface epitaxial layer 12a is gradually decreased toward the silicon oxide film 13. Also, a concavo-convex structure may be formed on the lower surface epitaxial layer 12a by the running of the monosilane gas and the hydrogen gas around the lower surface of the silicon substrate 11.

When a portion of the epitaxial layer formed on the upper surface (main surface) of the silicon substrate 11 (hereinafter, referred to as an upper surface epitaxial layer 12b) has a thickness of several micrometer (μm), the lower surface epitaxial layer 12a may be neglected because the thickness of the lower surface epitaxial layer 12a is several hundreds nanometer (nm). However, when the thickness of the upper surface epitaxial layer 12b is several tens micrometer, the following problem occurs because the thickness of the lower surface epitaxial layer 12a is several micrometer.

As shown in FIG. 1B, when the epitaxial wafer 10 is loaded on a conveyance arm 14, the contact between the epitaxial wafer 10 and the conveyance arm 14 is poor due to the shape of the lower surface epitaxial layer 12a, which would cause a trouble during conveyance of the epitaxial wafer 10.

As shown in FIG. 1C, when the epitaxial wafer 10 is suctioned to a stepper 15 during the forming of a resist pattern 16, the focus in the resist pattern 16 varies due to the uneven shape of the lower surface epitaxial layer 12a. As a result, the resist pattern grooves 17 have side walls with a concavo-convex structure. Also, it may be impossible to appropriately process the epitaxial wafer 10 due to poor suction between the epitaxial wafer 10 and the stepper 15.

As shown in FIG. 1D, when the epitaxial wafer 10 is wet etched while being placed on a stage 18, grooves 19 have concavo-convex side walls due to the uneven shape of the lower surface epitaxial layer 12a.

An object of the present invention is to provide a method of manufacturing a semiconductor wafer that is capable of preventing conveyance troubles and defects during a post process.

According to one aspect of the present invention, there is provided an improved method of manufacturing a semiconductor wafer. This manufacturing method includes a step of preparing a prime wafer. The manufacturing method also includes a step of forming a device layer or an epitaxial layer on at least a main surface (upper surface) of the prime wafer. The device layer may be created by an epitaxial growth process. The manufacturing method also includes a step of forming a protective film to cover at least the device layer. The manufacturing method also includes a first removing step of removing those portions of the protective film, which exclude a portion of the protective film corresponding to the upper surface of the prime wafer. This removing step may be carried out by wet etching. The manufacturing method also includes a step of grinding a lower surface of the prime wafer of the prime wafer. The manufacturing method also includes a second removing step of removing the portion of the protective film corresponding to the upper surface of the prime wafer. The second removing step may include wet etching.

The protective film forming step may include forming an additional protective film on the portion of the protective film corresponding to the upper surface of the prime wafer. The first removing step may include removing the additional protective film by wet etching.

The protective film may be a TEOS oxide film. Also, the additional protective film may be a negative resist or a positive resist.

The device layer is formed on at least the upper surface of the prime wafer by the epitaxial growth process. The protective film is then formed over at least the device layer. The lower surface of the prime wafer is ground to have a flat surface. Consequently, it is possible to manufacture a semiconductor wafer that is capable of preventing conveyance troubles and process defects at a post process.

The above and other objects, aspects and advantages of the present invention will become apparent to those skilled in the art from the following detailed description when read and understood in conjunction with the appended claims and accompanying drawings.

DETAILED DESCRIPTION OF THE INVENTION

Now, a preferred embodiment of the present invention, or a first embodiment of a semiconductor wafer manufacturing method, will be described in detail with reference to FIG. 2 and FIG. 3A to FIG. 3G of the accompanying drawings.

Figure 1A:
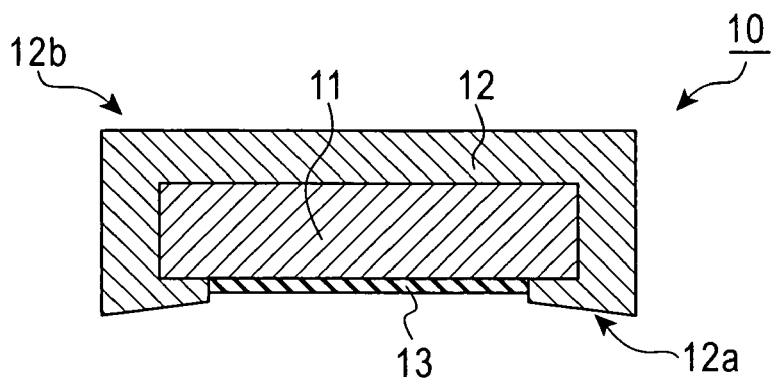
FIG. 1A is a cross-sectional view of a semiconductor wafer manufactured by a conventional semiconductor wafer manufacturing method.
Figure 1B:
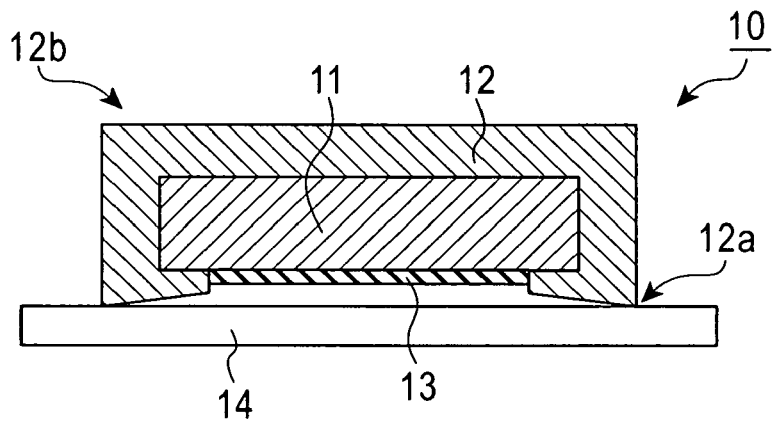
FIG. 1B is another cross-sectional view of the semiconductor wafer of FIG. 1A at the time of conveying the semiconductor wafer.
Figure 1C:
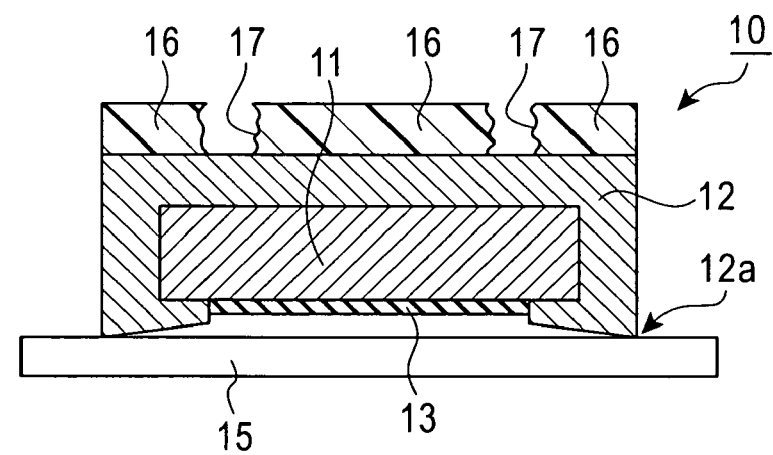
FIG. 1C is another cross-sectional view of the semiconductor wafer of FIG. 1A when a resist is formed thereon.
Figure 1D:
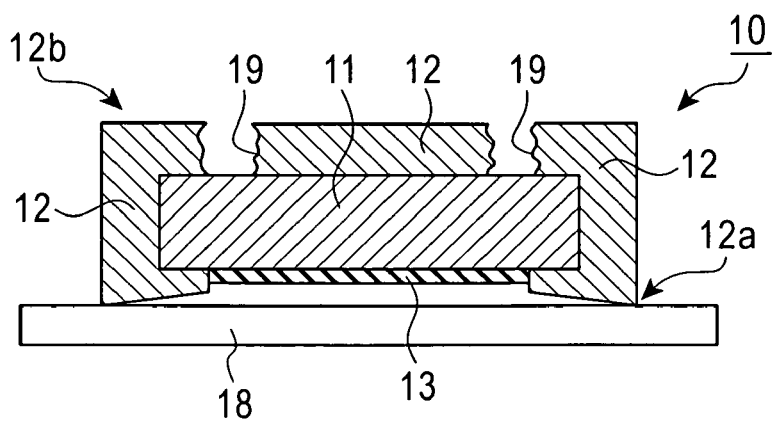
FIG. 1D is another cross-sectional view of the semiconductor wafer of FIG. 1A after an etching process.
Figure 2:
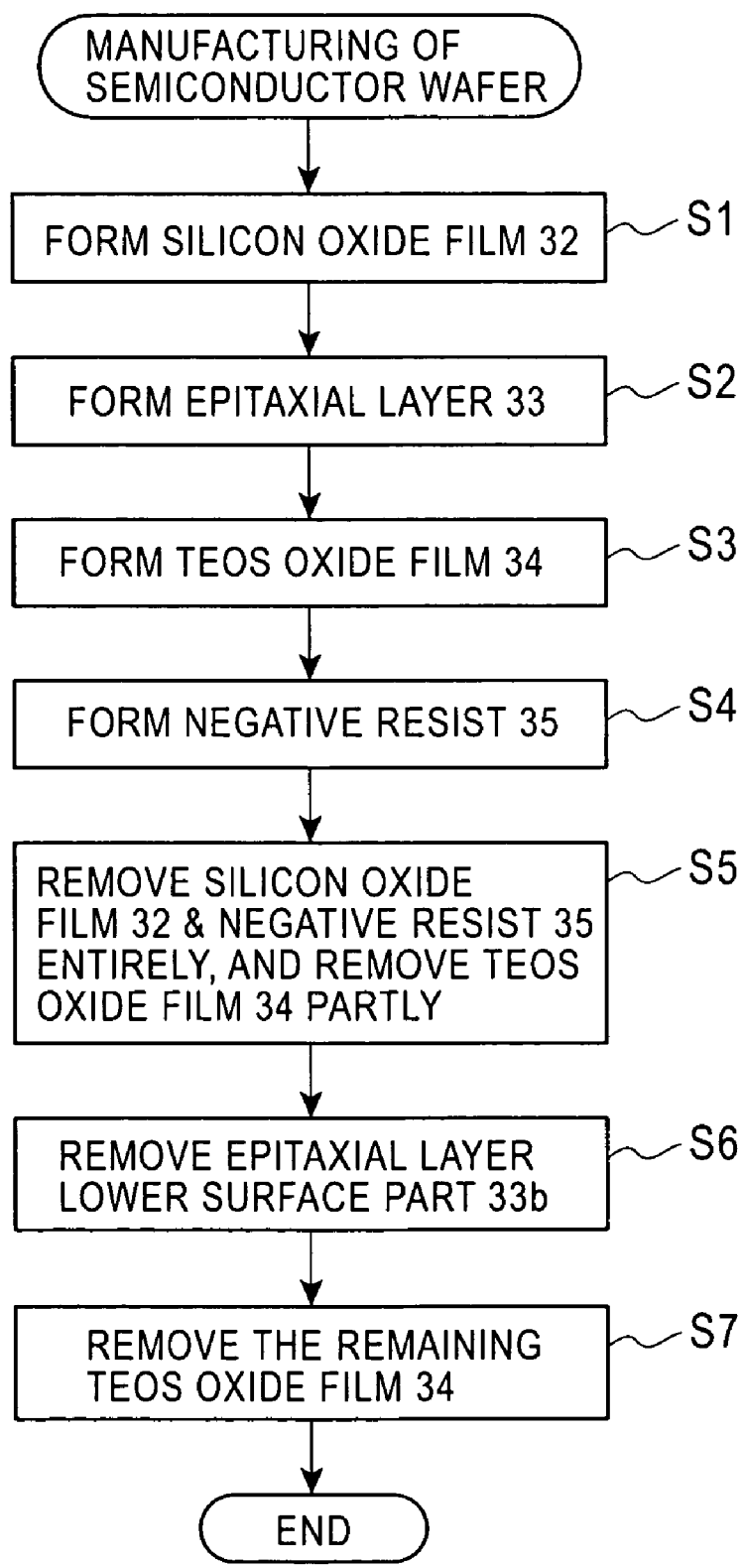
FIG. 2 is a flow chart illustrating a manufacturing method of a semiconductor wafer according to an embodiment of the present invention.
Figure 3A:
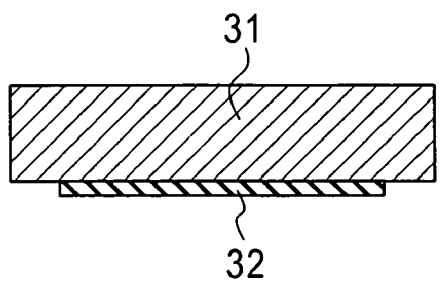
FIGS. 3A to 3G are a series of cross-sectional views illustrating respective manufacturing steps of the manufacturing method of the semiconductor wafer according to the embodiment of the present invention.

As shown in FIG. 3A, first, a prime wafer 31, which is a semiconductor substrate, is prepared, and a silicon oxide layer (32) is formed on the entire lower surface of the prime wafer 31 by a well-known process, such as a thermal oxidation process or a chemical vapor deposition (CVD) process. After that, a protective plate is placed on the lower surface of the prime wafer 31 excluding the circumferential part of the prime wafer 31. That portion of the silicon oxide layer (32) which is not covered by the protective plate (i.e., the circumferential part of the silicon oxide layer) is removed by etching to form a silicon oxide film 32 (Step S1 in FIG. 2). The silicon oxide film 32 prevents antimony in the prime wafer from diffusing to the outside. A cross-sectional view after forming the silicon oxide film 32 is shown in FIG. 3A. Here, the lower surface of the prime wafer 31 is defined to be the surface opposite the (upper or main) surface where a device layer will be formed. The device layer is a layer on which semiconductor elements will be provided (will be described).

Figure 3B:
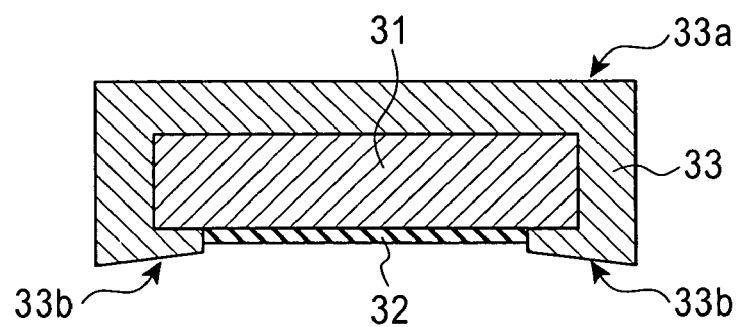

Subsequently, a device layer 33 (often referred to as an epitaxial layer 33), on which semiconductor elements will be formed at a subsequent process, is formed on at least the upper surface of the prime wafer 31 by an epitaxial growth process (Step S2). For example, the prime wafer 31 is heated to approximately 1150 degrees C. in a process chamber, and a monosilane gas and a hydrogen gas are introduced into the heated chamber. A cross-sectional view after forming the epitaxial layer 33 is shown in FIG. 3B. This process is referred to as a device layer forming process.

As shown in FIG. 3B, that portion 33b of the epitaxial layer 33 formed on the lower surface of the prime wafer 31 (hereinafter, referred to as an epitaxial layer lower surface part 33b) has a thickness less than the opposite portion 33a of the epitaxial layer 33 formed on the upper surface of the prime wafer 31 (hereinafter, referred to as an epitaxial layer upper surface part 33a). This is because the epitaxial layer lower surface part 33b is formed by the running of the monosilane gas and the hydrogen gas around the lower surface of the prime wafer 31. Also, the thickness of the epitaxial layer lower surface part 33b is gradually decreased toward the central part of the prime wafer 31. This gradual thickness reduction is also caused by the running of the monosilane gas and the hydrogen gas around the lower surface of the prime wafer 31. The epitaxial layer 33 is not formed on the silicon oxide film 32 although the monosilane gas and the hydrogen gas run around the silicon oxide film 32.

Figure 3C:
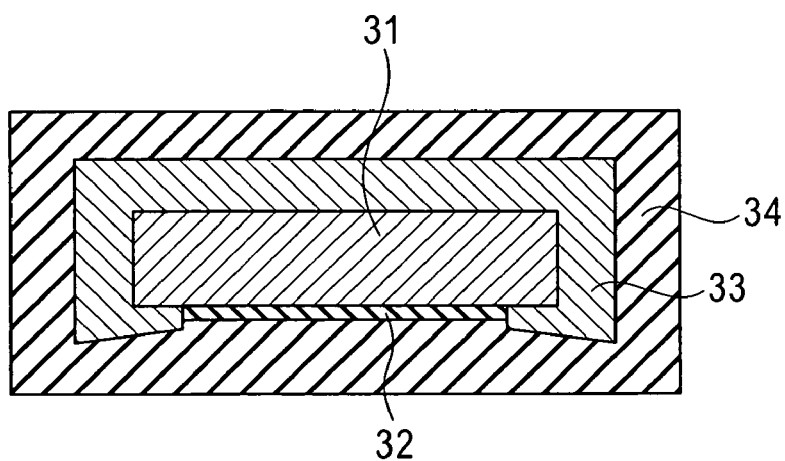

Subsequently, a TetraEthOxySilane (TEOS) oxide film 34, which is a protective film to cover the epitaxial layer 33 and the silicon oxide film 32, is formed (Step S3). For example, the TEOS oxide film 34 may have a thickness of approximately 8500 Å (angstroms). A cross-sectional view after forming the TEOS oxide film 34 is shown in FIG. 3C. This process is referred to as a protective film forming process.

Specifically, the TEOS oxide film 34 is formed as follows. First, heat treatment is carried out at a temperature of approximately 680 degrees C. for 10 minutes while a nitrogen gas is introduced into the process chamber. After that, the interior temperature of the chamber is increased by 1.3 degrees per minute until the interior temperature of the chamber reaches approximately 700 degrees C. Subsequently, heat treatment is carried out at a temperature of approximately 700 degrees C. for approximately 70 minutes while a TEOS gas and an oxygen gas are introduced into the chamber. Subsequently, the interior temperature of the chamber is decreased by 1.8 degrees C. per minute until the interior temperature of the chamber reaches approximately 680 degrees C. After that, heat treatment is carried out at a temperature of approximately 680 degrees C. for 10 minutes. It should be noted that the above-described process of forming the TEOS oxide film 34 is merely an example, and therefore, the above-mentioned conditions may be appropriately altered based on the film thickness and other properties of the TEOS oxide film 34.

Also, the TEOS oxide film 34 is a mere example of the protective film. Instead of the TEOS oxide film 34, it is possible to use a silane-based oxide film as the protective film.

Figure 3D:
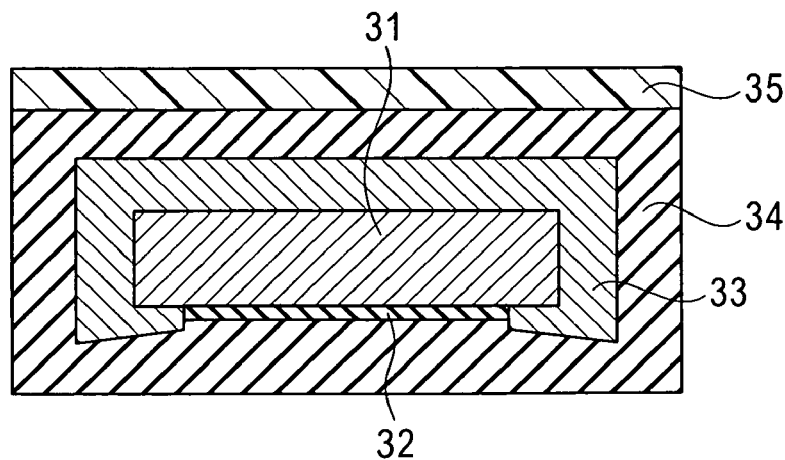

After Step S3, a negative resist 35, which is an additional protective film, is formed on that portion of the TEOS oxide film 34 which corresponds to the upper surface of the prime wafer 31 (Step S4). The negative resist 35 is provided to protect the TEOS oxide film 34 against wet etching (will be described later). For example, the negative resist 35 may have a film thickness of approximately 8000 Å. A cross-sectional view after forming the negative resist 35 is shown in FIG. 3D. This process is referred to as an additional protective film forming process.

Specifically, the negative resist 35 is formed as follows. For example, baking treatment is carried out at a temperature of approximately 200 degrees C. for approximately 60 seconds. After that, the negative resist 35 is applied. After the application of the negative resist 35, pre-baking treatment is carried out at a temperature of approximately 110 degrees C. for 60 seconds. It should be noted that the above-described process of forming the negative resist 35 is merely an example, and therefore, the above-specified conditions may be appropriately changed based on the film thickness and other properties of the negative resist 35.

Also, the use of the negative resist 35 for the additional protective film is a mere example. Instead of the negative resist 35, it is possible to use a positive resist as the additional protective film.

Figure 3E:
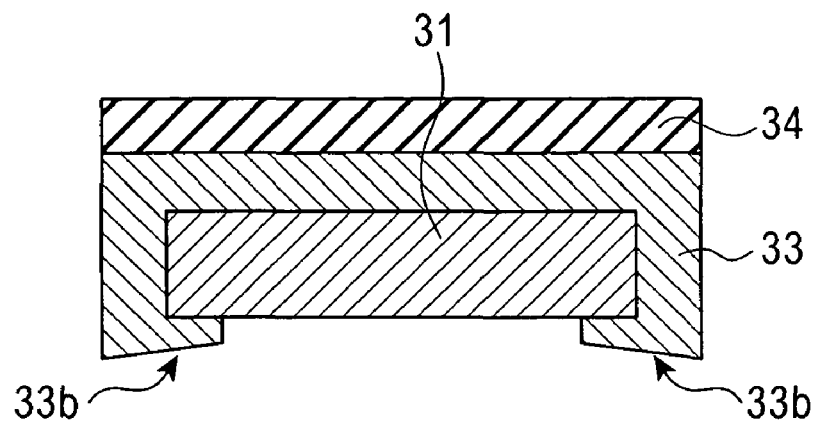

After Step S4, the silicon oxide film 32, the negative resist 35, and the side and bottom portions of the TEOS oxide film 34 are removed by wet etching (Step S5). For example, the wafer 31 is immersed in a water solution of a buffered hydrofluoric (BHF) acid for approximately 20 minutes. A cross-sectional view after wet etching is shown in FIG. 3E. This etching process is referred to as a first removing process.

At this etching process, the silicon oxide film 32, the negative resist 35, and the TEOS oxide film 34 are removed by etching. However, the negative resist 35 is present on the TEOS oxide film 34 over the upper surface of the prime wafer 31. As a result, the side and bottom portions of the TEOS oxide film 34 are removed, but the top portion of the TEOS oxide film 34 is not removed. The epitaxial layer 33 does not react with the etching solution. Thus, the epitaxial layer 33 is not removed.

The reason why the TEOS oxide film 34 is left only over the upper surface of the prime wafer 31 is because it can prevent the damage to the epitaxial layer 33 on the upper surface of the prime wafer 31 when grinding the lower surface of the prime wafer 31 at a subsequent process.

Figure 3F:
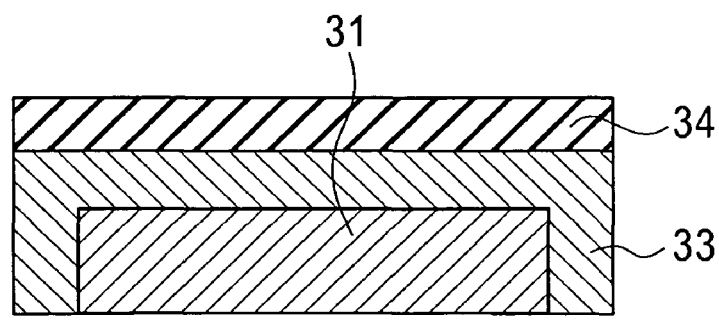

After Step S5, the lower surface of the prime wafer 31 is ground to remove the epitaxial layer lower surface part 33b formed on the lower surface of the prime wafer 31 (Step S6). When the epitaxial layer lower surface part 33b is removed, the entire lower surface of the prime wafer 31 is exposed, and therefore the lower surface of the prime wafer 31 is flattened. A cross-sectional view after removing the epitaxial layer lower surface part 33b is shown in FIG. 3F. This process is referred to as a grinding process.

For example, chemical mechanical polishing (CMP) is employed to remove the epitaxial layer lower surface part 33b and obtain the prime wafer 31 having a flat lower surface. The grinding rate may be 1900 Å per minute.

Figure 3G:
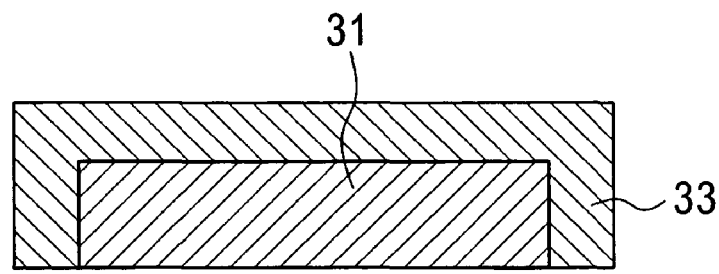

Subsequently, that portion of the TEOS oxide film 34 which is not removed at Step S5 (i.e., the portion corresponding to the upper surface of the prime wafer 31) is removed by wet etching (Step S7). At this step, the wafer may be immersed in a water solution of a buffered hydrofluoric (BHF) acid for approximately 20 minutes in the same manner as Step S5. A cross-sectional view after wet etching is shown in FIG. 3G. This etching process is referred to as a second removing process.

As described above, the epitaxial layer 33 is formed on at least the upper surface of the prime wafer 31 by an epitaxial growth process, the TEOS oxide film 34 is formed to cover at least the epitaxial layer 33, and the lower surface of the prime wafer 31 is ground. Consequently, it is possible to manufacture a semiconductor wafer that is capable of preventing conveyance troubles and process defects at a post process.

This application is based on Japanese Patent Application No. 2008-109924 filed on Apr. 21, 2008, and the entire disclosure thereof is incorporated herein by reference.

What is claimed is:

1. A method of manufacturing a semiconductor wafer, comprising:
    a step of preparing a prime wafer, the prime wafer having an upper surface, side surfaces and a lower surface;
    a step of forming a device layer on at least the upper surface of the prime wafer by an epitaxial growth process;
    a step of forming a protective film to cover at least the device layer, including forming an additional protective film on a portion of the protective film corresponding to the upper surface of the prime wafer;
    a first removing step of removing those portions of the protective film, which exclude the portion of the protective film corresponding to the upper surface of the prime wafer, by wet etching;
    a step of grinding the lower surface of the prime wafer; and
    a second removing step of removing the portion of the protective film corresponding to the upper surface of the prime wafer by wet etching.

2. The manufacturing method according to claim 1, wherein the first removing step includes removing the additional protective film by wet etching.

3. The manufacturing method according to claim 1, wherein the protective film is a TEOS oxide film.

4. The manufacturing method according to claim 1, wherein the additional protective film is a negative resist or a positive resist.

5. The manufacturing method according to claim 1, wherein the additional protective film has a thickness of about 8000 angstroms.

6. The manufacturing method according to claim 1, wherein the forming an additional protective film includes baking the prime wafer at about 200 degrees C. for 60 seconds and applying a negative resist on the upper surface of the prime wafer.

7. A method of manufacturing a semiconductor wafer, comprising:
    a step of preparing a prime wafer, the prime wafer having an upper surface, side surfaces and a lower surface;
    a step of forming a device layer on at least the upper surface of the prime wafer by an epitaxial growth process;
    a step of forming a protective film to cover at least the device layer;
    a first removing step of removing those portions of the protective film, which exclude a portion of the protective film corresponding to the upper surface of the prime wafer, by wet etching;
    a step of grinding the lower surface of the prime wafer;
    a second removing step of removing the portion of the protective film corresponding to the upper surface of the prime wafer by wet etching; and
    a step of forming a silicon oxide layer on the lower surface of the prime wafer except a periphery of the lower surface.

8. A method of manufacturing a semiconductor wafer, comprising:
    a step of preparing a prime wafer, the prime wafer having an upper surface, side surfaces and a lower surface;
    a step of forming a device layer directly on at least the upper surface of the prime wafer by an epitaxial growth process, the epitaxial growth process includes heating the prime wafer to about 1150 degrees C. in a process chamber and introducing a predetermined gas into the process chamber;
    a step of forming a protective film to directly cover at least the device layer;
    a first removing step of removing those portions of the protective film, which exclude a portion of the protective film corresponding to the upper surface of the prime wafer, by wet etching;
    a step of grinding the lower surface of the prime wafer; and
    a second removing step of removing the portion of the protective film corresponding to the upper surface of the prime wafer by wet etching.

9. The method of claim 8, wherein the device layer covers the upper surface, the side surfaces and a peripheral portion of the lower surface of the prime wafer.

10. A method of manufacturing a semiconductor wafer, comprising:
    a step of preparing a prime wafer, the prime wafer having an upper surface, side surfaces and a lower surface;
    a step of forming a device layer directly on at least the upper surface of the prime wafer by an epitaxial growth process;
    a step of forming a protective film to directly cover at least the device layer, the protective film having a thickness of about 8500 angstroms;

a first removing step of removing those portions of the protective film, which exclude a portion of the protective film corresponding to the upper surface of the prime wafer, by wet etching;

a step of grinding the lower surface of the prime wafer; and a second removing step of removing the portion of the protective film corresponding to the upper surface of the prime wafer by wet etching.

11. The method of claim 10, wherein the device layer covers the upper surface, the side surfaces and a peripheral portion of the lower surface of the prime wafer.

12. A method of manufacturing a semiconductor wafer, comprising:

a step of preparing a prime wafer, the prime wafer having an upper surface, side surfaces and a lower surface;

a step of forming a device layer on at least the upper surface of the prime wafer by an epitaxial growth process;

a step of forming a protective film to cover at least the device layer, including introducing a nitrogen gas into a process chamber, heat treating the prime wafer at about 600 degrees C. for about 10 minutes, then gradually heating the prime wafer to about 700 degrees C., introducing a TEOS and oxygen gas into a process chamber, and heat treating the prime wafer at about 700 degrees C. for about 70 minutes;

a first removing step of removing those portions of the protective film, which exclude a portion of the protective film corresponding to the upper surface of the prime wafer, by wet etching;

a step of grinding the lower surface of the prime wafer; and a second removing step of removing the portion of the protective film corresponding to the upper surface of the prime wafer by wet etching.

13. The manufacturing method according to claim 12, wherein the step of forming a protective film further includes decreasing the process chamber temperature to about 680 degrees C. and heat treating the prime wafer at about 680 degrees C. for about 10 minutes.

14. A method of manufacturing a semiconductor wafer, comprising:

a step of preparing a prime wafer, the prime wafer having an upper surface, side surfaces and a lower surface;

a step of forming a device layer directly on at least the upper surface of the prime wafer by an epitaxial growth process;

a step of forming a protective film to directly cover at least the device layer;

a first removing step of removing those portions of the protective film, which exclude a portion of the protective film corresponding to the upper surface of the prime wafer, by wet etching, the first removing step includes immersing the prime wafer in a BHF solution for about 20 minutes;

a step of grinding the lower surface of the prime wafer; and a second removing step of removing the portion of the protective film corresponding to the upper surface of the prime wafer by wet etching.

15. The method of claim 14, wherein the device layer covers the upper surface, the side surfaces and a peripheral portion of the lower surface of the prime wafer.

16. A method of manufacturing a semiconductor wafer, comprising:

a step of preparing a prime wafer, the prime wafer having an upper surface, side surfaces and a lower surface;

a step of forming a device layer directly on at least the upper surface of the prime wafer by an epitaxial growth process;

a step of forming a protective film to directly cover at least the device layer;

a first removing step of removing those portions of the protective film, which exclude a portion of the protective film corresponding to the upper surface of the prime wafer, by wet etching;

a step of grinding the lower surface of the prime wafer, including chemical mechanical polishing; and a second removing step of removing the portion of the protective film corresponding to the upper surface of the prime wafer by wet etching.

17. The method of claim 16, wherein the device layer covers the upper surface, the side surfaces and a peripheral portion of the lower surface of the prime wafer.

18. A method of manufacturing a semiconductor wafer, comprising:

a step of preparing a prime wafer, the prime wafer having an upper surface, side surfaces and a lower surface;

a step of forming a device layer directly on at least the upper surface of the prime wafer by an epitaxial growth process;

a step of forming a protective film to directly cover at least the device layer;

a first removing step of removing those portions of the protective film, which exclude a portion of the protective film corresponding to the upper surface of the prime wafer, by wet etching;

a step of grinding the lower surface of the prime wafer; and a second removing step of removing the portion of the protective film corresponding to the upper surface of the prime wafer by wet etching, including immersing the prime wafer in a BHF solution for about 20 minutes.

19. The method of claim 18, wherein the device layer covers the upper surface, the side surfaces and a peripheral portion of the lower surface of the prime wafer.

* * * * *